(12) United States Patent
Kim et al.

(10) Patent No.: US 12,085,602 B2
(45) Date of Patent: Sep. 10, 2024

(54) TEST CIRCUIT MONITORING PBTI AND OPERATING METHOD THEREOF

(71) Applicant: SK hynix Inc., Icheon-si (KR)

(72) Inventors: Min Cheol Kim, Icheon-si (KR); Mi Ran Kim, Icheon-si (KR); Chang Hwi Lee, Icheon-si (KR)

(73) Assignee: SK hynix Inc., Icheon-si (KR)

(*) Notice: Subject to any disclaimer, the term of this patent is extended or adjusted under 35 U.S.C. 154(b) by 42 days.

(21) Appl. No.: 18/079,489

(22) Filed: Dec. 12, 2022

(65) Prior Publication Data

US 2024/0003961 A1  Jan. 4, 2024

(30) Foreign Application Priority Data

Jun. 29, 2022 (KR) .................. 10-2022-0079919

(51) Int. Cl.
 *G01R 31/26* (2020.01)
(52) U.S. Cl.
 CPC ..... *G01R 31/2642* (2013.01); *G01R 31/2628* (2013.01)
(58) Field of Classification Search
 CPC ............ G01R 31/2621; G01R 31/2628; G01R 31/2642; G01R 31/2856; G01R 31/2874; G01R 31/2855; G01R 31/2858; G01R 31/2879; G01R 19/165; G01R 31/3181; G06F 11/008; G06F 11/3058; H03K 19/20; H03K 3/02335
 See application file for complete search history.

(56) References Cited

U.S. PATENT DOCUMENTS

| | | | | |
|---|---|---|---|---|
| 6,815,970 | B2 * | 11/2004 | Rost | G01R 31/287 324/762.02 |
| 6,879,177 | B1 * | 4/2005 | Bolam | G01R 31/2879 324/762.09 |
| 7,642,864 | B2 * | 1/2010 | Chuang | H03K 3/0315 324/649 |
| 9,086,865 | B2 * | 7/2015 | Bansal | G06F 1/26 |
| 9,857,409 | B2 * | 1/2018 | Kawa | G01R 31/2621 |
| 10,782,336 | B2 * | 9/2020 | Jenkins | G01R 31/2642 |
| 10,969,420 | B2 * | 4/2021 | Kwon | H03K 3/0315 |
| 2006/0282804 | A1 | 12/2006 | Ang et al. | |
| 2012/0182079 | A1 | 7/2012 | Kim et al. | |

* cited by examiner

*Primary Examiner* — Vinh P Nguyen
(74) *Attorney, Agent, or Firm* — WILLIAM PARK & ASSOCIATES LTD.

(57) ABSTRACT

The test circuit monitoring positive bias temperature instability (PBTI) includes a PBTI monitoring unit driven according to a power voltage, the PBTI monitoring unit outputting an output voltage having a potential that is equal to or lower than a potential of the power voltage according to a PBTI degradation rate of an NMOS transistor; and a degradation determiner for determining the PBTI degradation rate by comparing the potential of the output voltage to the potential of the power voltage.

15 Claims, 7 Drawing Sheets

100

110

DEVICE IN NORMAL STATE

DEVICE IN DEFECTIVE STATE

TEST CIRCUIT MONITORING PBTI AND OPERATING METHOD THEREOF

CROSS-REFERENCE TO RELATED APPLICATION

The present application claims priority under 35 U.S.C. § 119(a) to Korean patent application number 10-2022-0079919, filed on Jun. 29, 2022, in the Korean Intellectual Property Office, the entire disclosure of which is incorporated herein by reference.

BACKGROUND

Technical Field

The present disclosure generally relates to a test circuit and an operating method thereof, and more particularly, to a test circuit monitoring positive bias temperature instability (PBTI) and an operating method of the test circuit.

Related Art

A transistor is stressed by bias or temperature. The reliability of the transistor may decrease due to stress. The reliability of the transistor may have influence on the lifetime of an integrated circuit, i.e., the lifetime of a product, and may be the cause of a defect. Therefore, the reliability of the transistor should be evaluated in a test process.

Due to negative bias temperature instability (NBTI) or positive bias temperature instability (PBTI), a threshold voltage of the transistor may increase, and a drain current may decrease. In the existing test method, a propagation delay of an inverter chain or a clock characteristic (e.g., a frequency or a duty ratio) of a ring oscillator was tested so as to evaluate PBTI. Such a test circuit requires a large-area circuit configuration and requires a separate circuit configuration for monitoring and result determination by using a current-based operating method.

SUMMARY

In accordance with an aspect of the present disclosure, there is provided a test circuit including: a positive bias temperature instability (PBTI) monitoring unit driven according to a power voltage, the PBTI monitoring unit outputting an output voltage having a potential that is equal to or lower than a potential of the power voltage according to a PBTI degradation rate of an NMOS transistor; and a degradation determiner configured to determine the PBTI degradation rate by comparing the potential of the output voltage to the potential of the power voltage, wherein the PBTI monitoring unit includes: an inverter driven by the power voltage and a ground voltage, the inverter receiving the output voltage, inverting the received output voltage, and outputting the inverted output voltage as an output signal; and a NAND gate driven by the power voltage and the ground voltage, the NAND gate performing a logical combination on the output signal and the output voltage and outputting, as the output voltage, a voltage that is obtained by performing the logical combination. In accordance with another aspect of the present disclosure, there is provided a method of operating a test circuit, the method including: providing the test circuit, wherein the test circuit includes: a positive bias temperature instability (PBTI) monitoring unit driven according to a power voltage, the PBTI monitoring unit outputting an output voltage having a potential that is equal to or lower than a potential of the power voltage according to a PBTI degradation rate of an NMOS transistor; and a degradation determiner configured to determine the PBTI degradation rate by comparing the potential of the output voltage to the potential of the power voltage; setting the power voltage to an initial setting level and applying the set power voltage to the PBTI monitoring unit; comparing a potential of the set power voltage to the potential of the output voltage that is output from the PBTI monitoring unit; and checking a degradation rate corresponding to the potential of the set power voltage when the potential of the output voltage is lower than the potential of the set power voltage.

In accordance with still another aspect of the present disclosure, there is provided a method of operating a test circuit, the method including: providing the test circuit, wherein the test circuit includes: a positive bias temperature instability (PBTI) monitoring unit driven according to a power voltage, the PBTI monitoring unit outputting an output voltage having a potential that is equal to or lower than a potential of the power voltage according to a PBTI degradation rate of an NMOS transistor; and a degradation determiner configured to determine the PBTI degradation rate by comparing the potential of the output voltage to the potential of the power voltage; setting a detection voltage corresponding to an allow-limit degradation rate; setting the detection voltage as the power voltage, and applying the set power voltage to the PBTI monitoring unit; comparing a potential of the set power voltage to the potential of the output voltage that is output from the PBTI monitoring unit; and determining whether a device is in a normal state or a defective state, based on a result that is obtained by comparing the potential of the set power voltage to the potential of the output voltage.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Embodiments provide a test circuit having a decreased area and an operating method of the test circuit.

Figure 1:
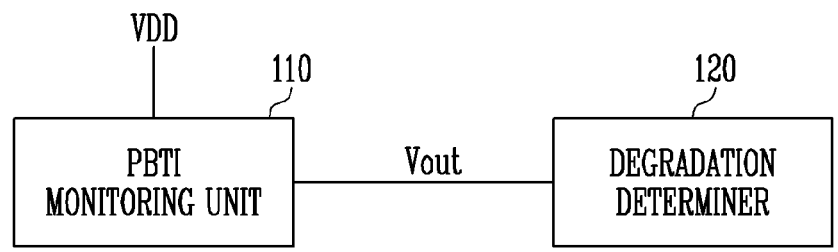

FIG. 1 is a block diagram illustrating a configuration of a test circuit in accordance with an embodiment of the present disclosure.

Figure 2:
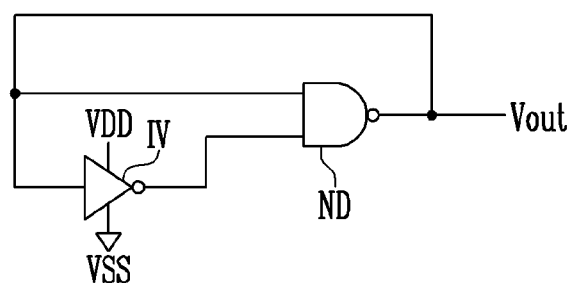

FIG. 2 is a configuration diagram illustrating a positive bias temperature instability (PBTI) monitoring unit shown in FIG. 1.

Figure 3:
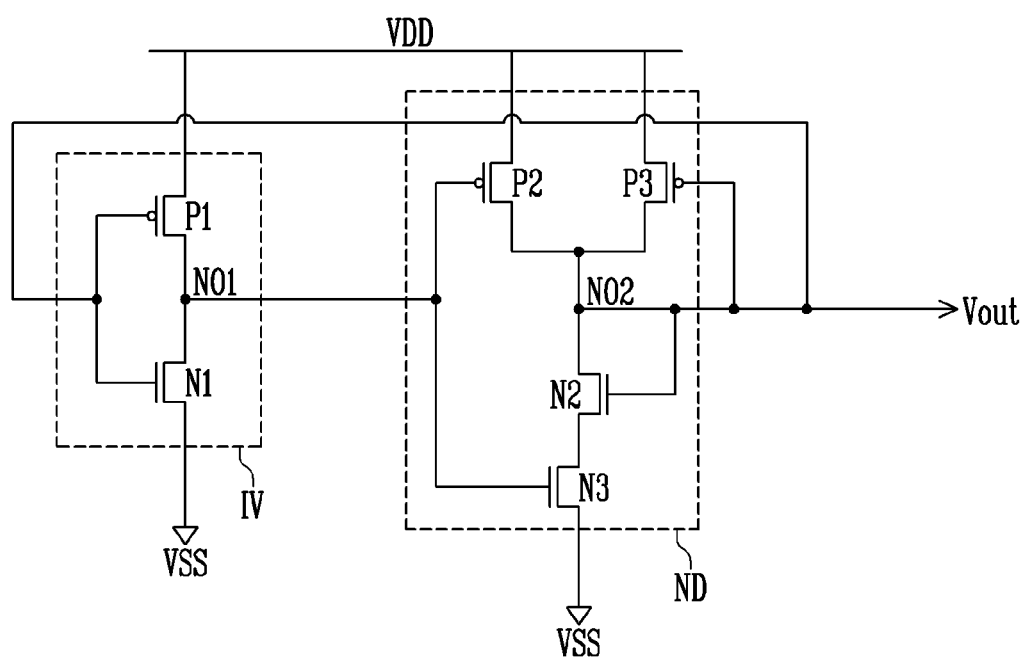
Figure 4:
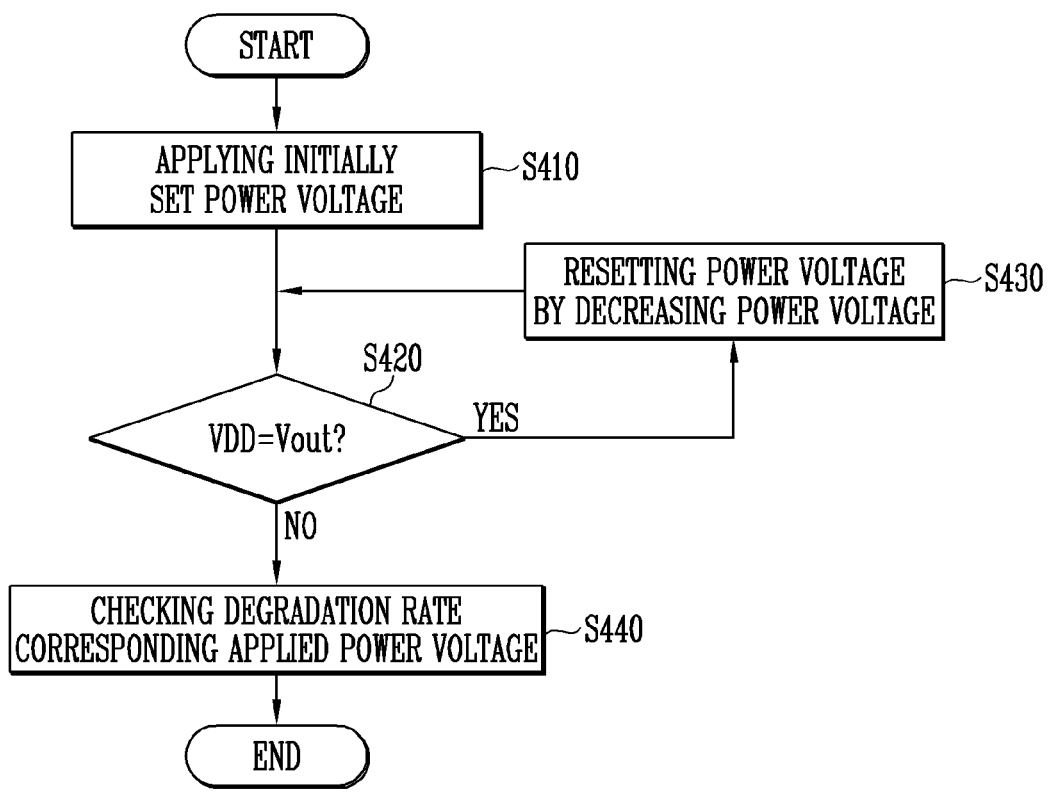

FIG. 3 is a detailed circuit diagram of the PBTI monitoring unit shown in FIG. 1, FIG. 4 is a flowchart illustrating an operation of the test circuit in accordance with an embodiment of the present disclosure.

Figure 5:
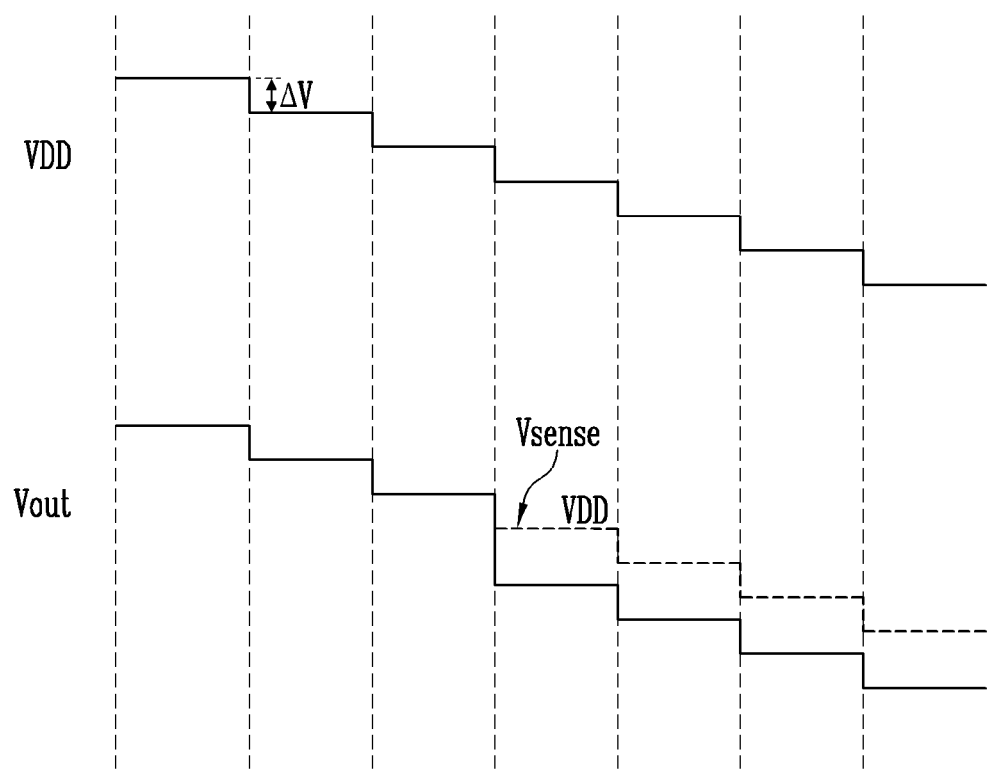

FIG. 5 is a waveform diagram of a power voltage and an output voltage, illustrating an operation of the test circuit in accordance with an embodiment of the present disclosure.

Figure 6:
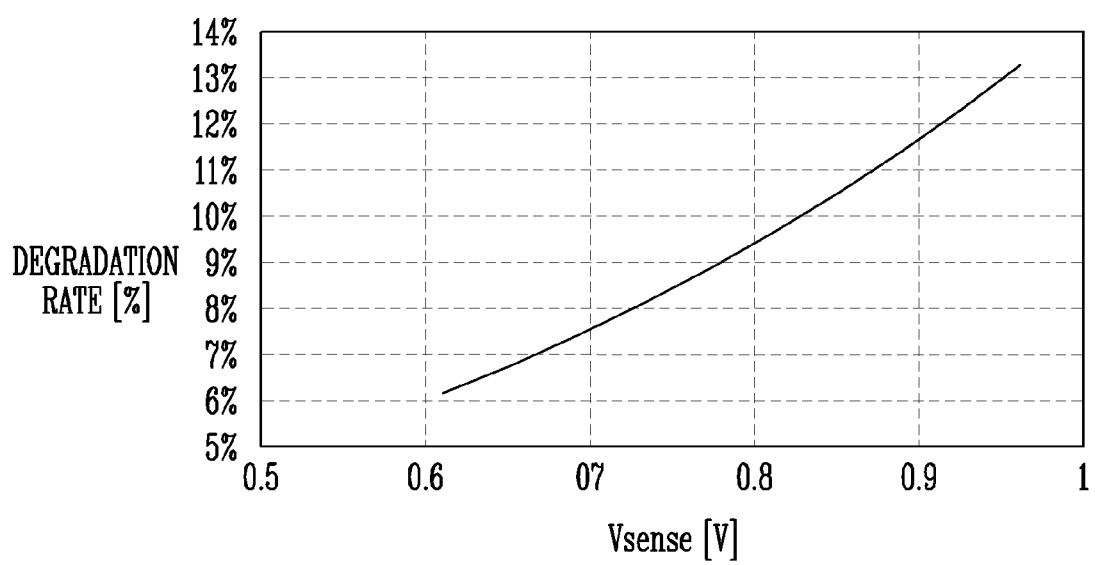

FIG. 6 is a graph of detection voltage and degradation rate, illustrating an operation of the test circuit in accordance with an embodiment of the present disclosure.

Figure 7:
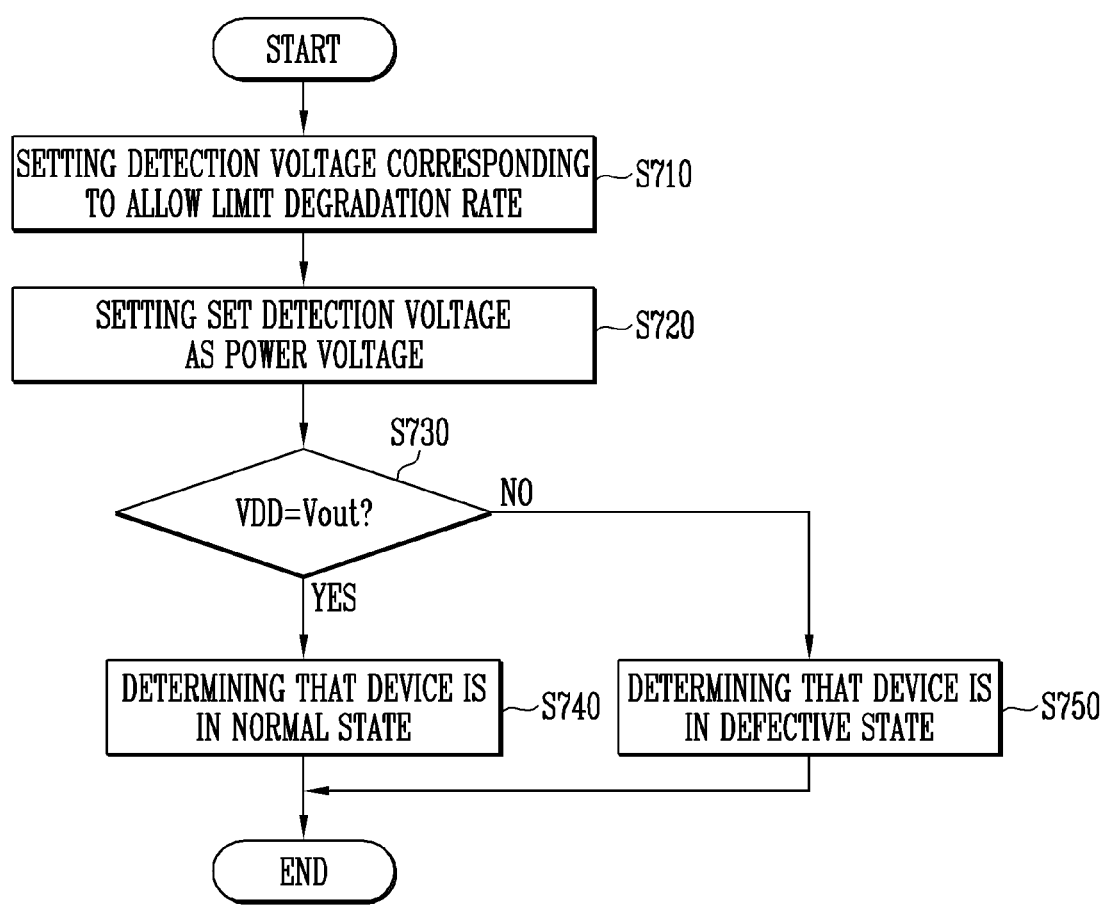

FIG. 7 is a flowchart illustrating an operation of the test circuit in accordance with another embodiment of the present disclosure.

Figure 8:
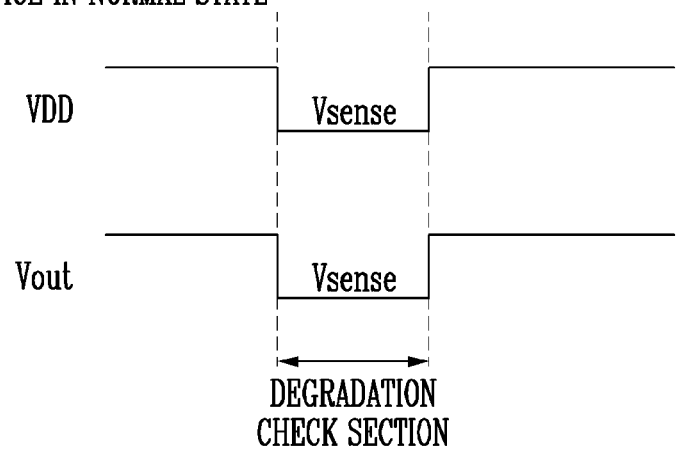
Figure 8:
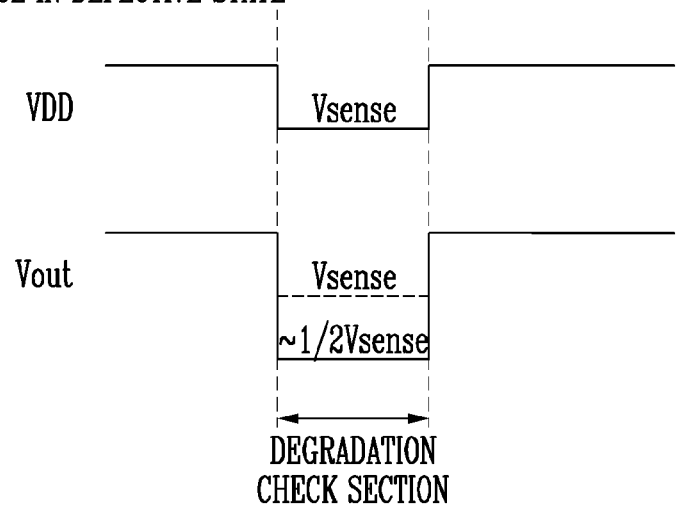

FIG. 8 is a waveform diagram of the power voltage and the output voltage, illustrating an operation of the test circuit in accordance with another embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

FIG. 1 is a block diagram illustrating a configuration of a test circuit in accordance with an embodiment of the present disclosure.

The test circuit 100 may be included in a device such as an electronic device including a transistor. The test circuit 100 may be a circuit for measuring reliability of a transistor. Due to positive bias temperature instability (PBTI), a threshold voltage of the transistor may increase, and a drain current may decrease. The test circuit 100 may measure a degradation degree of the transistor due to the PBTI by using a logic gate configured with transistors and may determine the reliability of transistors included in an electronic device according to the measured degradation degree.

Referring to FIG. 1, the test circuit 100 may include a PBTI monitoring unit 110 and a degradation determiner 120.

The PBTI monitoring unit 110 may be driven according to a power voltage VDD, and the PBTI monitoring unit 110 may output an output voltage Vout having the same potential level as the power voltage VDD or may output an output voltage Vout having a lower potential level than the power voltage VDD according to a degradation degree. For example, the PBTI monitoring unit 110 may output the output voltage Vout having a potential level that is lower than the potential level of the power voltage VDD when a threshold voltage increases as a target transistor degrades. For example, the output voltage Vout may become low down to ½ of the potential level of the power voltage VDD. The power voltage VDD that is applied to the PBTI monitoring unit 110 may be set to gradually decrease downwardly according to time.

The degradation determiner 120 may receive the output voltage Vout to determine whether the target transistor has degraded. For example, when a potential of the output voltage Vout is lower than a potential of the power voltage VDD, the degradation determiner 120 may determine that the target transistor has degraded. Also, the degradation determiner 120 may determine a degradation degree of the target transistor. The degradation determiner 120 may store detection voltage level information corresponding to a degradation rate of a transistor, determine the power voltage VDD to be a detection voltage at a time at which the potential of the output voltage Vout becomes lower than the potential of the power voltage VDD, and determine a degradation rate corresponding to the detection voltage as the degradation rate of the transistor.

FIG. 2 is a configuration diagram illustrating the PBTI monitoring unit shown in FIG. 1.

Referring to FIG. 2, the PBTI monitoring unit 110 may include an inverter IV and a NAND gate ND.

The inverter IV may receive an output voltage Vout of the NAND gate ND, invert the output voltage Vout, and then output the inverted output voltage. The inverter IV may receive a power voltage VDD and a ground voltage VSS as a driving power source.

The NAND gate ND may receive an output signal and an output voltage Vout of the inverter IV, perform a logical combination on the output signal and the output voltage Vout, and then output a voltage, obtained by performing the logical combination, as the output voltage Vout. The NAND gate ND may receive the power voltage VDD and the ground voltage VSS as a driving power source.

The PBTI monitoring unit 110 may output an output voltage Vout having a level of the power voltage VDD in a normal state in which transistors, constituting the inverter IV and the NAND gate ND, are not degraded.

For example, the output voltage Vout in an initial state in which the power voltage VDD is not activated may have a level of the ground voltage VSS, and the inverter IV and the NAND gate ND may be driven from a time at which the power voltage VDD is activated and applied, to output the output voltage Vout having the level of the power voltage VDD. For example, when the output voltage Vout has the level of the ground voltage VSS, the inverter IV may receive the output voltage Vout and may output an output signal having the level of the power voltage VDD. The NAND gate ND may output the output voltage Vout having the level of the power voltage VDD in response to the output signal of the inverter IV. Subsequently, the NAND gate ND may continuously output the output voltage Vout having the level of the power voltage VDD, regardless of the output signal of the inverter IV, in response to the output voltage Vout having the level of the power voltage VDD.

When a threshold voltage increases as an NMOS transistor, i.e., a target transistor constituting the inverter IV, degrades, the PBTI monitoring unit 110 may output an output voltage having a potential that is lower than the level of the power voltage VDD at a time at which the power voltage VDD having a certain level is applied. This will be described in detail with reference to FIG. 3 which will be described later.

FIG. 3 is a detailed circuit diagram of the PBTI monitoring unit shown in FIG. 1.

Referring to FIG. 3, the PBTI monitoring unit 110 may include an inverter IV and a NAND gate ND.

The inverter IV may include a PMOS transistor P1 and an NMOS transistor N1. The PMOS transistor P1 and the NMOS transistor N1 may be connected in series between a power voltage VDD and a ground voltage VSS, and a gate of each of the PMOS transistor P1 and the NMOS transistor N1 may be connected to an output node NO2. The PMOS transistor P1 and the NMOS transistor N1 may be turned on or turned off in response to an output voltage Vout.

The NAND gate ND may include PMOS transistors P2 and P3 and NMOS transistors N2 and N3.

A PMOS transistor P2 and a PMOS transistor P3 may be connected in parallel between the power voltage VDD and the output node NO2. A gate of the PMOS transistor P2 may be connected to a node NO1 as an output node of the inverter IV, and a gate of the PMOS transistor P3 may be connected to the output node NO2. Accordingly, the PMOS transistor P2 may be turned on or turned off in response to a potential of the node N01, and the PMOS transistor P3 may be turned on or turned off in response to a potential of the output node NO2.

An NMOS transistor N2 and an NMOS transistor N3 may be connected in series between the output node NO2 and the ground voltage VSS. A gate of the NMOS transistor N2 may be connected to the output node NO2, and a gate of the PMOS transistor N3 may be connected to the node NO1. Accordingly, the NMOS transistor N2 may be turned on or turned off in response to the potential of the output node NO2, and the NMOS transistor N3 may be turned on or turned off in response to the potential of the node N01.

An operation of the PBTI monitoring unit 110 in a state in which a target transistor, i.e., the NMOS transistor N1 has not degraded will be described as follows.

The inverter IV and the NAND gate ND may be driven by the power voltage VDD and the ground voltage VSS.

The PMOS transistor P1 of the inverter IV may apply the power voltage VDD to the node N01 in response to the output voltage Vout having an initial level of the ground voltage VSS, In addition, the NMOS transistor N1 of the inverter IV may be turned off in response to the output voltage Vout having the initial level of the ground voltage VSS.

The PMOS transistor P2 of the NAND gate ND may be turned off in response to the potential of the node N01 to which the power voltage VDD is applied, and the NMOS transistor N3 of the NAND gate ND may be turned on in response to the potential of the node NO1 to which the power voltage VDD is applied. The PMOS transistor P3 of the NAND gate ND may apply the power voltage VDD to the output node NO2 in response to the output voltage Vout having the initial level of the ground voltage VSS. Accordingly, the output voltage Vout may increase to a level of the power voltage VDD.

In addition, when the output voltage Vout increases to the level of the power voltage VDD, the PMOS transistor P1 of the inverter IV may be turned off in response to the output voltage Vout, and the NMOS transistor N1 of the inverter may apply the ground voltage VSS to the node NO1 in response to the output voltage Vout.

The PMOS transistor P2 of the NAND gate ND may apply the power voltage VDD to the output node NO2 in response to the potential of the node NO1 to which the ground voltage VSS is applied, and the NMOS transistor N3 of the NAND gate ND may be turned off in response to the potential of the node N01, Accordingly, the output voltage Vout may maintain the level of the power voltage VDD.

An operation of the PBTI monitoring unit 110, when a threshold voltage increases as the target transistor, i.e., the NMOS transistor N1, degrades will be described as follows.

The inverter IV and the NAND gate ND may be driven by the power voltage VDD and the ground voltage VSS.

The PMOS transistor P1 of the inverter IV may apply the power voltage VDD to the node N01 in response to the output voltage Vout having the initial level of the ground voltage VSS. In addition, the NMOS transistor N1 of the inverter IV may be turned off in response to the output voltage Vout having the initial level of the ground voltage VSS.

The PMOS transistor P2 of the NAND gate ND may be turned off in response to the potential of the node N01 to which the power voltage VDD is applied, and the NMOS transistor N3 of the NAND gate ND may be turned on in response to the potential of the node NO1 to which the power voltage VDD is applied. The PMOS transistor P3 of the NAND gate ND may apply the power voltage VDD to the output node NO2 in response to the output voltage Vout having the initial level of the ground voltage VSS, Accordingly, the output voltage Vout may increase to the level of the power voltage VDD.

When the output voltage Vout may increase to the level of the power voltage VDD, the PMOS transistor P1 of the inverter IV may be turned off in response to the output voltage Vout, and the NMOS transistor N1 of the inverter IV may apply the ground voltage VSS to the node N01 in response to the output voltage Vout. However, when the NMOS transistor N1 degrades due to PBTI, a threshold voltage of the NMOS transistor N1 may increase, and therefore, the potential of the node NO1 may be formed higher than a potential of the ground voltage VSS. Accordingly, the PMOS transistor P2 of the NAND gate ND might not be turned on in response to the potential of the node N01, which is higher than the potential of the ground voltage VSS. Accordingly, the potential of the output node NO2 may be formed lower than the potential of the power voltage VDD.

FIG. 4 is a flowchart illustrating an operation of the test circuit in accordance with an embodiment of the present disclosure.

FIG. 5 is a waveform diagram of the power voltage and the output voltage, illustrating an operation of the test circuit in accordance with an embodiment of the present disclosure.

FIG. 6 is a graph of detection voltage and degradation rate, illustrating an operation of the test circuit in accordance with an embodiment of the present disclosure.

An operation of the test circuit in accordance with an embodiment of the present disclosure will be described as follows with reference to FIGS. 1 to 6.

In step S410, the potential level of the power voltage VDD may be initially set, and the initially set power voltage VDD may be applied to the test circuit 100, The initially set power voltage VDD may be preferably set as the highest power voltage level.

Accordingly, the PBTI monitoring unit 110 may be driven according to the initially set power voltage VDD. The inverter IV of the PBTI monitoring unit 110 may be driven by receiving the initially set power voltage VDD and the ground voltage VSS as a driving power source. The inverter IV of the PBTI monitoring unit 110 may receive an output voltage Vout of the NAND gate ND, invert the output voltage Vout, and output the inverted output voltage. The NAND gate ND may receive an output signal and an output voltage Vout of the inverter IV, perform a logical combination on the output signal and the output voltage Vout, and then output a voltage that is obtained by performing the logical combination as the output voltage Vout.

In the PBTI monitoring unit 110, as described above with reference to FIG. 3, the potential of the output voltage Vout may be equal to or lower than a potential of the initially set power voltage VDD according to a degradation degree of the target transistor, i.e., the NMOS transistor N1.

In step S420, the degradation determiner 120 may receive the output voltage Vout that is output from the PBTI monitoring unit 110 and may compare the output voltage Vout to a currently used power voltage VDD. That is, the degradation determiner 120 may determine whether the potential of the output voltage Vout is equal to the potential of the power voltage VDD or whether the potential of the output voltage Vout is lower than the potential of the power voltage VDD.

Referring to the determination result of the above-described step S420, when it is determined that the potential of the output voltage Vout is equal to the potential of the power voltage VDD (YES), in step S430, the power voltage VDD may be reset by decreasing a potential level of the currently used power voltage VDD by a step voltage ΔV.

The reset power voltage VDD may be applied to the PBTI monitoring unit 110, and the PBTI monitoring unit 110 may be driven by the reset power voltage VDD to generate and output an output voltage Vout. Subsequently, the operation of the test circuit may be performed again, starting from the above-described step S420.

Referring to the determination result of the above-described step S420, when it is determined that the potential of the output voltage Vout is lower than the potential of the power voltage VDD (NO), in step S440, the degradation determiner 120 may check a degradation rate of the target transistor, which corresponds to the currently used power voltage VDD, based on detection voltage level information corresponding to a stored degradation rate of a transistor.

For example, the degradation determiner 120 may detect, as a detection voltage Vsense at a time at which it is determined that the potential of the output voltage Vout is lower than the potential of the power voltage VDD, and check a degradation rate corresponding to the detected detection voltage Vsense as shown in FIG. 6.

As described above, in the operation of the test circuit in accordance with the embodiment of the present disclosure, the power voltage VDD may be applied to the test circuit 100, and it can be determined whether the transistor has degraded according to whether the potential of the output voltage Vout that is output from the PBTI monitoring unit 110 is lower than the potential of the power voltage VDD.

In addition, as the power voltage VDD that is applied gradually decreases, the power voltage VDD may be detected as a detection voltage Vsense at a timing at which the potential of the output voltage Vout is lower than the potential of the power voltage VDD, and the degradation rate of the transistor can be checked according to the detected detection voltage Vsense.

FIG. 7 is a flowchart illustrating an operation of the test circuit in accordance with another embodiment of the present disclosure.

FIG. 8 is a waveform diagram of the power voltage and the output voltage, illustrating an operation of the test circuit in accordance with another embodiment of the present disclosure.

An operation of the test circuit in accordance with another embodiment of the present disclosure will be described as follows with reference to FIGS. 1 to 3 and 6 to 8.

In another embodiment of the present disclosure, a case in which a degradation check operation is performed during a general operation of a device including the test circuit 100 will be described as an example.

In step S710, an allow-limit degradation rate of a transistor may be set, and a detection voltage Vsense corresponding to the set allow-limit degradation rate may be set.

For example, when the allow-limit degradation rate of the transistor is 10%, the degradation determiner 120 may check a detection voltage Vsense corresponding to when a degradation rate of the transistor is 10% based on detection voltage level information corresponding to the degradation rate of the transistor.

In step S720, the degradation determiner 120 may set the set detection voltage Vsense as a power voltage VDD.

Subsequently, the PBTI monitoring unit 110 may be driven according to the set power voltage VDD. The inverter IV of the PBTI monitoring unit 110 may be driven by receiving an initially set power voltage VDD and a ground voltage VSS as a driving power source. The inverter IV of the PBTI monitoring unit 110 may receive an output voltage Vout of the NAND gate ND, invert the output voltage Vout, and output the inverted output voltage. The NAND gate ND may receive an output signal and an output voltage Vout of the inverter IV, perform a logical combination on the output signal and the output voltage Vout, and then output a voltage that is obtained by performing the logical combination as the output voltage Vout.

In the PBTI monitoring unit 110, as described above with reference to FIG. 3, the potential of the output voltage Vout may be equal to or lower than a potential of the initially set power voltage VDD according to a degradation degree of the target transistor, i.e., the NMOS transistor N1.

In step S730, the degradation determiner 120 may receive the output voltage Vout that is output from the PBTI monitoring unit 110 and may compare the output voltage Vout to the power voltage VDD. That is, the degradation determiner 120 may determine whether the potential of the output voltage Vout is equal to the potential of the power voltage VDD or whether the potential of the output voltage Vout is lower than the potential of the power voltage VDD.

As a determination result of the above-described step S730, when it is determined that the potential of the output voltage Vout is equal to the potential of the power voltage VDD (YES), the degradation determiner 120 may determine that the degradation degree of the NMOS transistor N1 is lower than the allow-limit degradation rate. Accordingly, it may be determined that the device including the test circuit 100 is in a normal state (S740).

As a determination result of the above-described step S730, when it is determined that the potential of the output voltage Vout is lower than the potential of the power voltage VDD (NO), the degradation determiner 120 may determine that the degradation degree of the NMOS transistor N1 exceeds the allow-limit degradation rate. Accordingly, it may be determined that the device including the test circuit 100 is in a defective state in which PST' degradation exceeds the allow-limit degradation rate (S750).

It can be determined whether the device is in the normal state or the defective state according to the above-described degradation check operation.

In accordance with the present disclosure, the configuration of the test circuit is simplified, thereby decreasing the area of the test circuit.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A test circuit comprising:
a positive bias temperature instability (PBTI) monitoring unit driven according to a power voltage, the PBTI monitoring unit outputting an output voltage having a potential that is equal to or lower than a potential of the power voltage according to a PBTI degradation rate of an NMOS transistor; and
a degradation determiner configured to determine the PBTI degradation rate by comparing the potential of the output voltage to the potential of the power voltage,
wherein the PBTI monitoring unit includes:
an inverter driven by the power voltage and a ground voltage, the inverter receiving the output voltage, inverting the received output voltage, and outputting the inverted output voltage as an output signal; and
a NAND gate driven by the power voltage and the ground voltage, the NAND gate performing a logical combination on the output signal and the output voltage and outputting, as the output voltage, a voltage that is obtained by performing the logical combination.

2. The test circuit of claim 1, wherein the inverter includes a PMOS transistor and an NMOS transistor, which are connected in series between the power voltage and the ground voltage, and
wherein a threshold voltage of the NMOS transistor varies according to the PBTI degradation rate.

3. The test circuit of claim 2, wherein the inverter outputs the output signal having a potential of the ground voltage by inverting the output voltage having the potential of the power voltage based on the PBTI degradation rate of the NMOS transistor or outputs the output signal having a potential that is lower than the potential of the power voltage and higher than the potential of the ground voltage.

4. The test circuit of claim 3, wherein, when the output signal has a potential that is lower than the potential of the power voltage and higher than the potential of the ground voltage, the NAND gate generates and outputs the output voltage having a potential that is lower than the potential of the power voltage.

5. The test circuit of claim 1, wherein the degradation determiner stores detection voltage level information corresponding to the PBTI degradation rate.

6. The test circuit of claim 5, wherein, when the potential of the output voltage is lower than the potential of the power voltage, the degradation determiner determines the power voltage to be a detection voltage and determines a degradation rate corresponding to the detection voltage as the PBTI degradation rate.

7. A method of operating a test circuit, the method comprising:
providing the test circuit, wherein the test circuit includes:
a positive bias temperature instability (PBTI) monitoring unit driven according to a power voltage, the PBTI monitoring unit outputting an output voltage having a potential that is equal to or lower than a potential of the power voltage according to a PBTI degradation rate of an NMOS transistor; and a degradation determiner configured to determine the PBTI degradation rate by comparing the potential of the output voltage to the potential of the power voltage;
setting the power voltage to an initial setting level and applying the set power voltage to the PBTI monitoring unit;
comparing a potential of the set power voltage to the potential of the output voltage that is output from the PBTI monitoring unit; and
checking a degradation rate corresponding to the potential of the set power voltage when the potential of the output voltage is lower than the potential of the set power voltage.

8. The method of claim 7, wherein, when the potential of the output voltage is equal to the potential of the set power voltage, the set power voltage is reset by decreasing the set power voltage by a step voltage, and then the operation of the test circuit is performed again, starting from the applying of the set power voltage to the PBTI monitoring unit.

9. The method of claim 7, wherein the PBTI monitoring unit includes:
an inverter that receives the output voltage, inverts the received output voltage, and outputs the inverted output voltage as an output signal; and
a NAND gate that receives the output voltage and the output signal, performs a logical combination on the output signal and the output voltage, and outputs a voltage that is obtained by performing the logical combination as the output voltage, and
wherein, in the applying of the set power voltage to the PBTI monitoring unit, the inverter outputs the output signal having a potential of a ground voltage according to the PBTI degradation rate or outputs the output signal having a potential that is lower than the potential of the set power voltage and higher than the potential of the ground voltage.

10. The method of claim 9, wherein, in the applying of the set power voltage to the PBTI monitoring unit, when the output signal has a potential that is lower than the set power voltage and higher than the potential of the ground voltage, the NAND gate generates and outputs the output voltage having a potential that is lower than the potential of the set power voltage.

11. A method of operating a test circuit, the method comprising:
providing a device including the test circuit, wherein the test circuit includes: a positive bias temperature instability (PBTI) monitoring unit driven according to a power voltage, the PBTI monitoring unit outputting an output voltage having a potential that is equal to or lower than a potential of the power voltage according to a PBTI degradation rate of an NMOS transistor; and a degradation determiner configured to determine the PBTI degradation rate by comparing the potential of the output voltage to the potential of the power voltage;
setting a detection voltage corresponding to an allow-limit degradation rate;
setting the detection voltage as the power voltage, and applying the set power voltage to the PBTI monitoring unit;
comparing a potential of the set power voltage to the potential of the output voltage that is output from the PBTI monitoring unit; and determining whether the device is in a normal state or a defective state based on a result that is obtained by comparing the potential of the set power voltage to the potential of the output voltage.

12. The method of claim 11, wherein, when the potential of the output voltage is equal to the potential of the set power voltage, it is determined that the device is in the normal state by determining that the PBTI degradation rate is lower than the allow-limit degradation rate.

13. The method of claim 11, wherein, when the potential of the output voltage is lower than the potential of the set power voltage, it is determined that the device is in the defective state by determining that the PBTI degradation rate exceeds the allow-limit degradation rate.

14. The method of claim 11, wherein the PBTI monitoring unit includes:
 an inverter that receives the output voltage, inverts the received output voltage, and outputs the inverted output voltage as an output signal; and
 a NAND gate that receives the output voltage and the output signal, performs a logical combination on the output signal and the output voltage, and outputs a voltage that is obtained by performing the logical combination as the output voltage, and
 wherein, in the applying of the set power voltage to the PBTI monitoring unit, the inverter outputs the output signal having a potential of a ground voltage according to the PBTI degradation rate or outputs the output signal having a potential that is lower than the potential of the set power voltage and higher than the potential of the ground voltage.

15. The method of claim 14, wherein, in the applying of the set power voltage to the PBTI monitoring unit, when the output signal has a potential that is lower than the set power voltage and higher than the potential of the ground voltage, the NAND gate generates and outputs the output voltage having a potential that is lower than the potential of the set power voltage.

* * * * *